(12) United States Patent
Koyama et al.

(10) Patent No.: US 6,602,753 B2
(45) Date of Patent: Aug. 5, 2003

(54) SEMICONDUCTOR DEVICE HAVING A GATE INSULATING FILM COMPRISING A METAL OXIDE AND METHOD OF MANUFACTURING THE SAME

(75) Inventors: Masato Koyama, Miura-gun (JP); Akira Nishiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/911,397

(22) Filed: Jul. 25, 2001

(65) Prior Publication Data

US 2002/0014634 A1 Feb. 7, 2002

(30) Foreign Application Priority Data

Jul. 26, 2000 (JP) ........................................ 2000-225740
Dec. 18, 2000 (JP) ........................................ 2000-383878

(51) Int. Cl.$^7$ ............................................ H01L 21/336
(52) U.S. Cl. ...................... 438/287; 438/216; 438/591; 438/785; 438/786
(58) Field of Search ................................ 438/216, 287, 438/591, 785, 786

(56) References Cited

U.S. PATENT DOCUMENTS 5,688,724 A * 11/1997 Yoon et al. .................. 438/778
6,020,243 A * 2/2000 Wallace et al. .............. 438/287
6,383,873 B1 * 5/2002 Hegde et al. ................ 438/287

OTHER PUBLICATIONS

Byoung Hun Lee, et al, "Ultrathin Hafnium Oxide with Low Leakage and Excellent Reliability for Alternative Gate Dielectric Application", Technology Digest of IEDM, 1999, pp. 133–136.

* cited by examiner

Primary Examiner—Amir Zarabian
Assistant Examiner—Christy Novacek
(74) Attorney, Agent, or Firm—Oblon, Spivak, McClelland, Maier & Neustadt, P.C.

(57) ABSTRACT

There is disclosed a method of manufacturing a semiconductor device, wherein a thin film containing a metal and capable of bonding with oxygen is deposited on a silicon substrate, a metal oxide film is formed on the thin film, and the thin film is oxidized by heat treatment to form a gate insulating film comprising the oxidized thin film and the metal oxide film.

22 Claims, 9 Drawing Sheets

SEMICONDUCTOR DEVICE HAVING A GATE INSULATING FILM COMPRISING A METAL OXIDE AND METHOD OF MANUFACTURING THE SAME

CROSS-REFERENCE TO RELATED APPLICATIONS

This application is based upon and claims the benefit of priority from the prior Japanese Patent Applications No. 2000-225740, filed Jul. 26, 2000; and No. 2000-383878, filed Dec. 18, 2000, the entire contents of both of which are incorporated by reference.

BACKGROUND OF THE INVENTION

1. Field of the Invention

This invention relates to a method of manufacturing a semiconductor device and, in particular, a method of manufacturing a semiconductor device where a metal oxide is employed as a gate insulating film. This invention relates to a field effect transistor wherein a titanium oxide is employed as a gate insulating film.

2. Description of the Related Art

The gate insulating film to be employed in a CMOS (Complementary Metal-Oxide Semiconductor) of so-called sub-0.1 $\mu$m generation is required to meet the specification of 1.5 nm based on an $SiO_2$ film. Since an $SiO_2$ film having a thickness of 1.5 nm is insufficient in insulating properties in view of the direct tunnel current, technical studies on so-called High-K insulating films are now extensively conducted for realizing a capacity corresponding to that of an $SiO_2$ film having a thickness of 1.5 nm while making it possible to secure a sufficient degree of insulating properties by physically increasing the film thickness by using a material exhibiting a larger relative dielectric constant than that of $SiO_2$.

One of the most important problems on the occasion of applying this High-K material to the gate insulating film of CMOS is how to control the interface between the High-K material and an Si substrate. An $SiO_2$ layer is inevitably produced at this interface between the High-K material and an Si substrate, so that the controlling of the thickness of this $SiO_2$ layer becomes a very serious technical problem. Since the entire thickness of a laminate structure containing the $SiO_2$ layer to be formed at the interface and the High-K material is required to be confined to that corresponding to 1.5 nm of an $SiO_2$ layer, the thickness of this interface $SiO_2$ layer is required to be confined to less than 1.5 nm.

Several methods have been already developed for inhibiting the formation of an $SiO_2$ layer at the interface between the High-K material and an Si substrate. As for the method of forming the High-K material, there have been proposed various methods. In this specification however, two specific methods will be exemplified for illustrating the conventional method of suppressing the formation of this interface $SiO_2$ layer.

A first example is a method wherein the surface of a Si substrate is covered with an SiON or SiN layer, on which a metal constituting a High-K material is physically deposited and the metal thus deposited is oxidized to form a metal oxide (a High-K gate insulating film). By the terms "High-K gate insulating film", it generally means an oxide of one or more kinds of metal, and hence the expression "metal oxide" will be employed hereinafter synonymous with this High-K material. According to this method wherein the High-K material is formed through the oxidation of metal, the oxidation of the surface of Si substrate can be certainly partially suppressed due to the interposition of the SiON or SiN layer. However, the effect of suppressing the oxidation in this method is reported to be insufficient, allowing an $SiO_2$ layer to be formed to a thickness of 3 nm or more. Further, since this method is accompanied with a restriction that a temperature of as high as 700° C. is typically required for the oxidation of metal in order to obtain a desired High-K material, it is expected to be difficult to obtain the aforementioned specification corresponding to that of $SiO_2$ film having a thickness of as high as 1.5 nm for instance. Moreover, the introduction of nitrogen atoms into the interface leads to the generation of side effects such as a lattice defect, thereby often inviting deterioration in the electric properties of the interface.

A second example is a method wherein a metal constituting a High-K material is thinly deposited on the surface of an Si substrate and then, annealed in vacuum, after which a metal oxide is deposited on the annealed metal layer by a reactive sputtering method using a mixed gas comprising a strictly controlled mixing ratio of oxygen/argon gases. According to this method, the thin metal film initially deposited functions as a barrier layer against the oxidation of the surface of an Si substrate on the occasion of subsequently depositing a metal oxide on the Si substrate. This method however is accompanied with a problem in the aforementioned step of vacuum annealing after the deposition of a metal. Although it is not made clear in this conventional method with respect to the role of the vacuum annealing, the metal is permitted to react with Si due to this annealing, and as a result, a metal silicide is expected to be produced, inevitably resulting in the diffusion of metal atoms into the Si substrate. The metal atoms diffused into the Si substrate would become a trapping center for the carriers to thereby deteriorate the performance of the device.

Additionally, there is still a problem which is common to both of these conventional methods, i.e. a problem of re-growth of $SiO_2$ at the interface in a step subsequent to the formation of a gate insulating film. It is required, for the purpose of electrically activating a high-concentration impurity region, to heat-treat this impurity region at a temperature of as high as 900° C. or more. When the substrate is exposed to such a high temperature, a new growth of an $SiO_2$ film is caused to generate at the interface between the High-K film and the Si substrate. The oxygen acting as a source to bring about this additional oxidation is quite frequently formed of by a residual in the metal oxide.

The reason for adopting a method of forming a metal oxide layer by the post-oxidation of a metal layer that has been formed in advance using a metal in either of the aforementioned two different conventional methods is that if a metal oxide is directly deposited on the Si substrate or on the SiON(SiN) film, the Si substrate or the SiON(SiN) film is also oxidized during the process of depositing the metal oxide, thus resulting in the formation of an interface film having an increased thickness. However, as explained above, although these conventional methods are aimed at suppressing the formation of an oxide interface layer, there are problems that they involve the side effect of deterioration in the electric properties of the resultant device, and also that the effect of suppressing the formation the interface layer according to these conventional methods is still insufficient.

Incidentally, as for the materials which are expected to be useful for the formation of the High-K gate insulating film, they include various kinds of metal oxide such as $TiO_2$, $Ta_2O_5$, $ZrO_2$, $HfO_2$, $La_2O_3$, etc. Among these metal oxides, $TiO_2$ (titanium oxide) is known as being the most prospective material for the formation of a ferroelectric gate insulating film in view of the actual use thereof in LSIs up to date as a dielectric material for the capacitor of a DRAM, etc. However, $TiO_2$ is featured in that it is highly reactive with silicon as compared with other kinds of metal oxide material, indicating that $TiO_2$ is prone to form an interface oxide film mainly comprising $SiO_2$ as compared with other kinds of metal oxide, and that $TiO_2$ is not suited, in view of such characteristic, for use in forming the High-K gate insulating film.

As explained above, although there have been many attempts to control the $SiO_2$ interface layer in the conventional methods of forming the High-K gate insulating film, the effect of suppressing the formation of the $SiO_2$ layer is insufficient in principle. Even if the conventional method is successful in suppressing the formation of the $SiO_2$ interface layer, it has been very difficult to avoid the side effects including the deterioration of electric properties of the resultant device and the diffusion of metal into a Si substrate. There is also a problem of re-growth of $SiO_2$ at the interface, which unavoidably occurs in a step subsequent to the formation of gate insulating film. Furthermore, titanium oxide, whose physical characteristics are well known due to the actual use thereof in an LSI up to date is prone to form an oxide film at the interface thereof with a Si substrate, thereby obstructing the application thereof as a High-K gate insulating film.

BRIEF SUMMARY OF THE INVENTION

This invention has been accomplished with a view to overcome the aforementioned problems, and therefore, an object of this invention is to provide a method of manufacturing a semiconductor device, which is capable of suppressing not only the formation of the $SiO_2$ interface layer without inviting the generation of side-effects or the re-growth of $SiO_2$ at the interface in a step subsequent to the formation of the gate insulating film, thereby making it possible to form a High-K gate insulating film which is excellent in general-purpose properties.

Another object of this invention is to provide a semiconductor device which is capable of realizing not only excellent interface properties but also a high capacity of 1.5 nm or less based on the $SiO_2$ film, and also capable of suppressing the generation of a tunnel current.

According to this invention, there is provided a method of manufacturing a semiconductor device, comprising:

depositing a thin film containing a metal and capable of bonding with oxygen on a silicon substrate;

forming a metal oxide film on the thin film; and oxidizing the thin film by heat treatment to form a gate insulating film comprising the oxidized thin film and the metal oxide film.

According to this invention, there is further provided a method of manufacturing a semiconductor device, comprising:

removing an oxide film formed on a surface of a silicon substrate;

forming a buffer layer on the silicon substrate by sputtering using a titanium oxide as a target under an oxygen gas flow rate ranging from 0 sccm to 1.2 sccm, the buffer layer having a thickness of 2 nm or less and comprising an oxide containing titanium and silicon with an atomic percentage of the titanium being in the range of 1 to 8%; and forming a gate insulating film comprising a titanium oxide on the buffer layer by sputtering using a titanium oxide as a target under an oxygen gas flow rate of not less than 10 sccm.

According to this invention, there is further provided a semiconductor device, comprising:

a silicon substrate;

a buffer layer formed on the silicon substrate, the buffer layer having a thickness of 2 nm or less and comprising an oxide containing titanium and silicon with an atomic percentage of the titanium being in the range of 1 to 8%;

a gate insulating film containing titanium oxide and formed on the buffer layer;

a gate electrode formed on the gate insulating film; and source and drain regions formed in the silicon substrate regions.

DETAILED DESCRIPTION OF THE INVENTION

The present invention will be explained in further detail.

In the manufacturing method of a semiconductor device according to one embodiment of the present invention, a thin film which contains a metal and is capable of bonding with oxygen is formed at first, and then, a metal oxide film is deposited thereon. The thin film containing a metal and having the capability to bond with oxygen is subsequently heated, thereby enabling it to be bonded with oxygen, the resultant film functioning as an Si surface oxidation preventive film.

Even among the conventional methods, there is known a method wherein a metal film is employed as a Si oxidation preventive film. According to this conventional method however, a metal layer is required to be annealed after the deposition of the metal layer. The annealing however leads to the diffusion of metal into the Si substrate as mentioned above, thereby deteriorating the performance of the device. Whereas, according to the present invention, the thin film containing a metal, having the capability to bond with oxygen, and functioning as an Si surface oxidation preventive film acts to suppress the oxidation of the surface of Si substrate in the initial stage of depositing the metal oxide. Additionally, in a subsequent stage of heat treatment, the thin film reacts with oxygen in preference to Si, thus absorbing oxygen, thereby making it possible to suppress the oxidation of the surface of Si substrate. Moreover, the oxygen thus absorbed is allowed to bond with the metal, thereby turning this thin film containing a metal and having the capability to bond with oxygen into a stable metal oxide thin film.

Further, the conventional method is accompanied with a problem that the $SiO_2$ layer is allowed to regrow at the interface on the occasion of high-temperature heat treatment which will be performed in a subsequent step after the formation of gate insulating film, thereby deteriorating the capacity of the gate insulating film. As mentioned above, the re-growth of $SiO_2$ layer at the interface on the occasion of high-temperature heat treatment in the conventional method can be attributed to a residual quantity of oxygen in the metal oxide. Whereas, in this embodiment, this residual quantity of oxygen can be removed, through a heat treatment, by the thin film containing a metal and having capability to bond with oxygen (Si surface oxidation preventive film). As a result, it is now possible to suppress such an additional re-growth of $SiO_2$ as seen in the conventional method.

The thin film containing a metal and having the capability to bond with oxygen and which is designed to be formed on the Si substrate in this embodiment is only required to have a capability of bonding with oxygen, so that it is possible to employ a metal or a material other than metal as this thin film. For example, it is possible to employ a metal nitride or a metal oxide whose composition is offset in stoichiometric composition toward the oxygen shortage side. In particular, the employment of a metal oxide film is preferable in view of obtaining excellent characteristics at the interface between the Si substrate and the oxide. As for the metal to be included in the thin film, specific examples thereof include Ti, Ta, Zr, Hf, La, Mg, Al, Y, Bi and Ce. The employment of Ti, Zr, Hf and La is particularly preferable in view of the thermal stability of the resultant oxide, a high relative dielectric constant thereof, and a low reducibility thereof against Si. Further, the thin film may contain Si atoms therein.

As for the method of forming the thin film containing a metal and having the capability to bond with oxygen, there are no particular limitations. Therefore, it is possible to employ a sputtering method, a CVD method, an electronic beam vapor deposition method, etc. It is preferable, for the purpose of preventing the surface of Si from being oxidized during the deposition of this thin film, to perform deposition of the thin film in an atmosphere containing a low concentration of oxygen, more preferably in an atmosphere which is free of oxygen. More specifically, the concentration of oxygen on the occasion of depositing the thin film should preferably be about $10^{-3}$ Pa or less.

As for the thickness of the thin film, it can be suitably determined depending on the features of the metal to be employed, the relative dielectric constant of the oxide, the magnitude of leak current, etc. For example, where $TiO_x$ (x<2) is employed, the thickness of the thin film should preferably be confined to the range of 0.5 to 2 nm.

Subsequent to the deposition of the thin film containing a metal and having the capability of bonding with oxygen, a metal oxide film is successively deposited thereon. As for the materials for this metal oxide film, specific examples thereof include $TiO_2$, $ZrO_2$, $HfO_2$, $La_2O_3$, $Ta_2O_5$, MgO, $Al_2O_3$, $Y_2O_5$, $BiO_2$, $CeO_2$, etc. In view of the interface stability with respect to Si and of the thermal stability, which the metal oxide is demanded to have, the employment of $TiO_2$, $ZrO_2$, $HfO_2$, $La_2O_3$ is especially preferable. These metal oxides may contain Si therein. In view of the interface stability between the thin film containing a metal and having the capability of bonding with oxygen and the metal oxide film, and in view of simplification of the entire process, the metal to be contained in this metal oxide film should preferably be identical with the metal to be contained in the thin film containing a metal and having capability of bonding with oxygen. However, it is also possible to employ a metal for this metal oxide film, which differs from that to be contained in the thin film. This metal oxide film can be deposited by a sputtering method, a CVD method, an electronic beam vapor deposition method, etc. It is preferable, on the occasion of depositing the metal oxide film, to employ an atmosphere containing a concentration of oxygen as low as possible. Because if the concentration of oxygen is excessive, the following inconveniences will occur. For example, if the thin film having the capability of bonding with oxygen contains a metal, this metal will be completely oxidized, thus losing the oxygen-absorbing capacity to be employed in a subsequent heat treatment. If the thin film having a capability of bonding with oxygen comprises a metal oxide having an oxygen shortage composition, the metal oxide would become a film of stoichiometric composition in the process of depositing the metal oxide in an environment containing an excessive quantity of oxygen. In either case, it would become difficult to achieve the object of the present invention which resides in the absorption of the excessive quantity of oxygen in a subsequent step.

Therefore, it is desired, for the purpose of avoiding the aforementioned inconveniences, to successively deposit the thin film having a capability of bonding with oxygen and the metal oxide film in the same apparatus, thereby avoiding the thin film from being adsorbed thereon with oxygen, carbon dioxide and water from the atmosphere. As a matter of fact however, since it is almost impossible to completely eliminate the ambient oxygen on the occasion of depositing the metal oxide film, it may be preferable to prepare the thin film having the capability of bonding with oxygen so as to provide a suitable thickness by taking into consideration the possibility that the thin film having the capability of bonding with oxygen will unavoidably take up oxygen.

As for the thickness of the metal oxide film, it can be suitably determined depending on the relative dielectric constant of metal oxide, the magnitude of leak current, etc. For example, where $TiO_2$ is employed, the thickness of the metal oxide film may be confined to the range of 1 to 5 nm.

In the method according to one embodiment of the present invention, a silicon substrate having the thin film having the capability of bonding with oxygen and the metal oxide deposited thereon is subsequently subjected to a heat treatment, thereby oxidize the thin film. The temperature and duration of the heat treatment can be suitably determined depending on the specification regarding the capacity of the gate insulating film which is demanded of depending on the generation of device, and also depending on the tolerance of leak current. However, the temperature of this heat treatment should preferably be performed at a maximum temperature permitted in the manufacturing process of a semiconductor device, i.e. 900 to 1050° C. This is intended to enable the thin film to absorb oxygen therein by taking advantage of the thermal process, such as the activating process of the high impurity concentration region, thereby minimizing the number of heating steps.

Incidentally, it is permitted in this heat treatment to oxidize not only the thin film having the capability of bonding with oxygen but also the surface of the silicon substrate. However, the oxidation of the surface of the silicon substrate should preferably be limited to about 0.5 nm or less in view of maintaining the capacity of the gate insulating film at a high level.

Since a residual quantity of oxygen contained in the metal oxide film can be almost completely absorbed in the underlying thin film having the capability of bonding with oxygen, the growth of the interface $SiO_2$ in a subsequent step can be effectively suppressed.

According to the method of this embodiment as explained above, it is now possible to form a gate insulating film structure of a metal oxide/Si which is tough enough to withstand a subsequent step while suppressing the oxidation of the surface of a Si substrate without inviting any deterioration in the performance of the resultant device.

Next, the manufacturing method of a MISFET (Metal-Insulator-Semiconductor Field Effect Transistor) according to one embodiment of this invention will be explained with reference to drawings.

EXAMPLE 1

Figure 1:
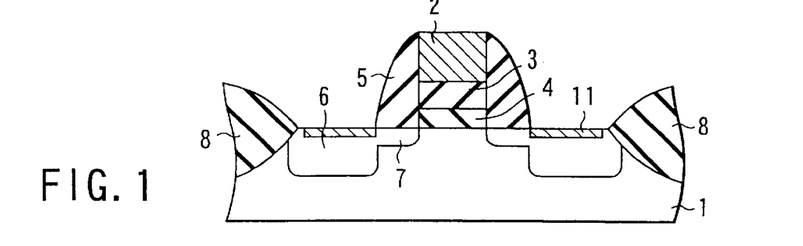
FIG. 1 is a cross-sectional view of an MISFET which has been manufactured according to the method representing one embodiment of the present invention.

FIG. 1 shows a cross-sectional view of an MISFET which has been manufactured according to the method representing one example of this invention.

As shown in FIG. 1, a laminated MIS structure comprising a metal film 2/a metal oxide layer 3/a gate insulating film 4 is formed on the surface of a Si substrate 1, wherein this laminated MIS structure is surrounded by a gate sidewall 5 comprising $SiO_2$, etc. In this Si substrate 1, there are formed a deep diffusion region 6 and a shallow diffusion region 7 each containing a high concentration of impurity and constructed in a self-aligned manner into an MIS structure. The surface of these regions is covered with a silicide 11.

FIGS. 2A and 2B and FIGS. 3A to 3C are cross-sectional views illustrating, stepwise, the manufacturing method of semiconductor device according to one example of this invention.

Figure 2A:
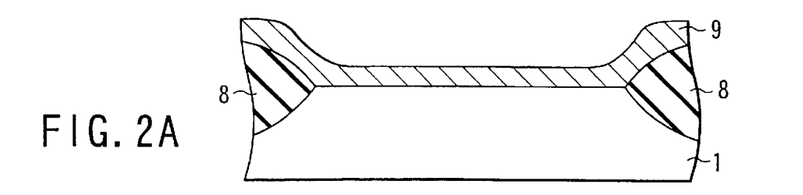
FIGS. 2A and 2B respectively shows a cross-sectional view illustrating, stepwise, the manufacturing method of the semiconductor device according to one embodiment of the present invention.

First of all, an Si substrate 1 provided with an element isolation region 8 which has been formed by way of ordinary process is prepared. Then, a thin film containing a metal and having the capability of bonding with oxygen (Si surface oxidation preventive film) 9 is uniformly deposited on the surface of the substrate 1 to prepare the structure as shown in FIG. 2A.

In this Example 1, a metal Ti was deposited to a thickness of 1 nm by an RF sputtering method to form a thin film 9 having the capability of bonding with oxygen. This deposition was performed using a Ti target under the conditions of: $10^{-3}$ Pa in base vacuum; 1 Pa in vacuum on the occasion of deposition; 22 sccm in Ar flow rate; and 60 W in electric power. As a result, the thin film 9 containing a thin metal Ti film and having the capability of bonding with oxygen was continuously deposited on the surface of Si substrate 1.

Figure 2B:
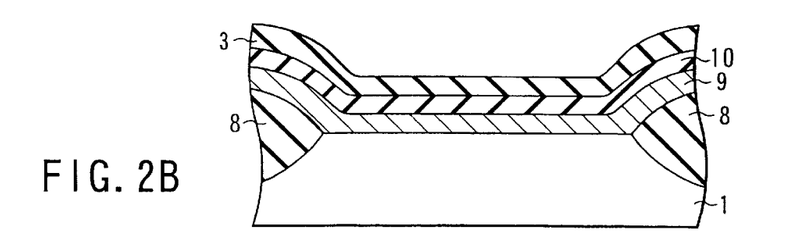

Then, the metal oxide film 3 is formed on the surface of the thin film 9 having the capability of bonding with oxygen as shown in FIG. 2B.

In this Example 1, the metal oxide film 3 containing $TiO_2$ was deposited, by the RF sputtering, to a thickness of 3 nm on the metal Ti film having a thickness of 1 nm and formed as the thin film 9 having the capability of bonding with oxygen. This deposition was performed using a $TiO_2$ target under the conditions of: $10^{-3}$ Pa in base vacuum; 1 Pa in vacuum on the occasion of deposition; 22 sccm in Ar flow rate; 1.2 sccm in oxygen flow rate; and 300 W in electric power. In the process of this deposition, the metal Ti film formed as the thin film 9 having the capability of bonding with oxygen was partially transformed into $TiO_2$. Namely, a portion of about 0.5 nm of the metal Ti film, out of 1 nm thickness thereof, was transformed into $TiO_2$ having a thickness of about 1 nm to thereby form an interface reaction layer 10 as shown in FIG. 2B, the residual portion of the metal Ti film 9 having a thickness of about 0.5 nm being left as it was between the interface reaction layer 10 and the Si substrate 1.

Figure 3A:
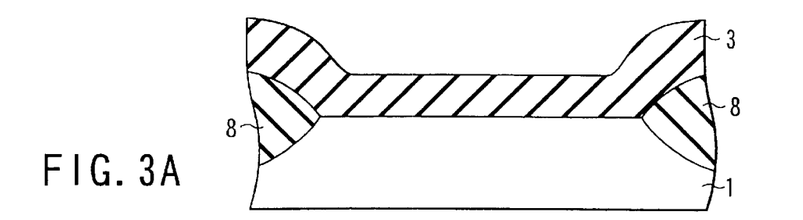
FIGS. 3A to 3C respectively shows a cross-sectional view illustrating, stepwise, the manufacturing method of the semiconductor device according to one embodiment of the present invention.

Then, the residual thin film 9 which was left between the Si substrate 1 and metal oxide layer 3 was oxidized by heat treatment to turn it into the metal oxide layer 3, thereby accomplishing a gate insulating film structure as shown in FIG. 3A. As for the source of oxygen for oxidizing the residual thin film, it may be obtained from various sources. For example, one of the oxygen sources may be oxygen atoms contained excessively in the metal oxide, or oxygen atoms diffused from the ambient atmosphere.

In this Example 1, the laminated structure of $TiO_2/Ti/Si$ was subjected to heat treatment in an Ar atmosphere for 60 minutes at a temperature of 700° C. Due to this heat treatment, the residual portion of metal Ti 0.5 nm in thickness was allowed to oxidize, thus enabling it to be transformed into a $TiO_2$ film having a thickness of about 1 nm. It is well known that Ti can be oxidized at a temperature of 700° C. As a result, it was possible to form a gate insulating film wherein TiO$_2$/Si are directly contacted with each other.

Figure 3B:
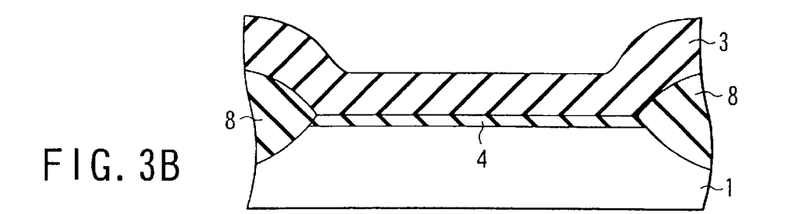

As a matter of fact, the electric properties of the interface can be greatly improved by interposing a thin SiO$_2$ layer between the metal oxide film 3 and the Si substrate 1. For this purpose, the thin film having the capability of bonding with oxygen should preferably be designed such that the thin film is deposited slightly thin so as to prevent it from being transformed into a complete metal oxide/Si system, and that the underlying Si substrate can be slightly oxidized through a heat treatment after the formation of the metal oxide film, thereby obtaining a SiO$_2$ 4 as shown in FIG. 3B.

Figure 4:
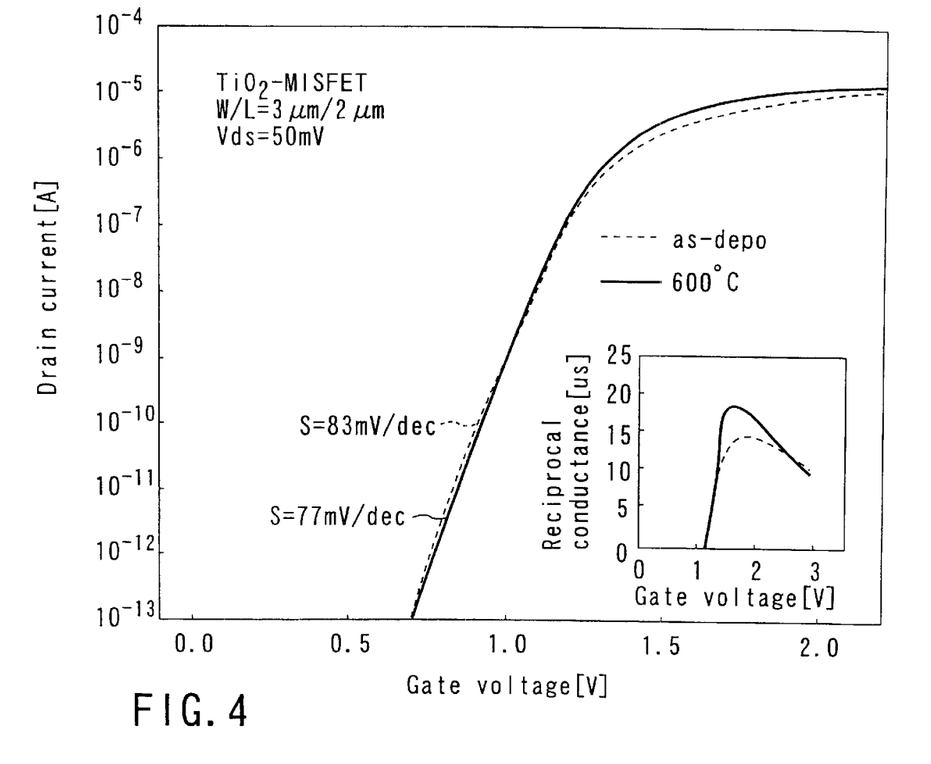
FIG. 4 is a graph illustrating the static characteristics of the MISFET according to Example 1 of the present invention.

FIG. 4 is a graph wherein a TiO$_2$/Si structure having an oxidizing interface and a TiO$_2$/Si structure not provided with such an oxidizing interface are compared with each other with respect to the transistor characteristics of a MISFET. When the TiO$_2$/Si structure is heat-treated at a temperature of 600° C. to oxidize the interface thereof, the characteristics of the TiO$_2$/Si interface can be made theoretically identical with the characteristics of the SiO$_2$/Si interface.

The covering of the surface of Si substrate with a metal on the occasion of depositing a metal oxide film is effective in minimizing the generation of a leak current. For example, when a gate insulating film was formed according to the aforementioned procedure by depositing a TiO$_2$ film after the deposition of a metal Ti film 2 nm in thickness on the surface of an Si substrate, the leak current density of the gate insulating film was decreased by two figures or more as compared with the case where TiO$_2$ was directly deposited on the surface of Si substrate by sputtering. This may be attributed to the effects of the metal film provided for the purpose of preventing the oxidation of the Si surface. Namely, it is assumed that this metal film is also capable of preventing the substrate from being damaged on the occasion of sputtering for depositing the oxide film.

Figure 3C:
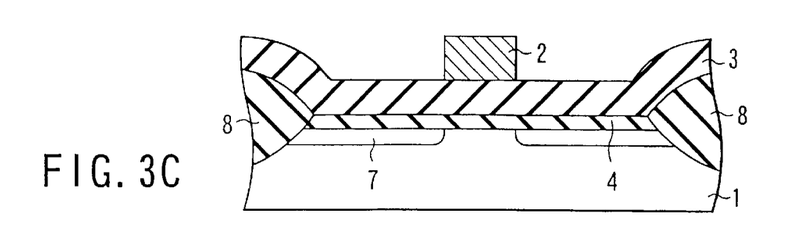

After the gate insulating film is formed in this manner, a gate electrode is deposited thereon as shown in FIG. 3C to thereby produce a MISFET, which is then subjected to the ordinary processes as conventionally known. For example, TiN is deposited as a gate electrode and worked using conventional methods, and a shallow diffusion layer 7 is formed in the substrate 1 by a self-alignment process. This shallow diffusion layer 7 can be formed by the procedures comprising an ion implantation and an activating heat treatment. This activating heat treatment can be performed at a high temperature of 900° C. or more.

According to the conventional method, there has been a great possibility that an additional growth of SiO$_2$ may be caused to occur at the metal oxide/Si interface on the occasion of this activating heat treatment. Whereas, according to the manufacturing method of this example, a residual quantity of oxygen which is possibly contained inside the metal oxide film 3 is absorbed by the thin film 9 having the capability of bonding with oxygen, so that as long as the oxidation and the diffusion of oxygen which may be caused to bring about by a heating atmosphere can be effectively inhibited, the growth of SiO$_2$ can be prevented in principle.

Incidentally, it is also possible to omit the aforementioned annealing step at a temperature of 700° C. which was conducted for obtaining the structure shown in FIG. 3A, and, instead of that, to oxidize the thin film 9 by the activating heat treatment to be performed for forming the shallow diffusion layer 7.

Thereafter, by the ordinary manufacturing procedures, the gate sidewall 5, the deep diffusion layer 6 and a silicide are formed successively to obtain the MISFET structure as shown in FIG. 1.

EXAMPLE 2

Next, Example 2 will be explained with reference to FIGS. 5A to 5C.

Figure 5A:
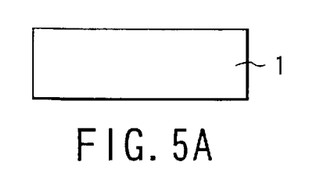
FIGS. 5A to 5C respectively shows a cross-sectional view illustrating, stepwise, the manufacturing method of the semiconductor device according to another example of the present invention.

First of all, as shown in FIG. 5A, the surface of the Si substrate 1 is treated to obtain a hydrogen-terminated structure so as to protect the surface of the Si substrate 1 from the attack of oxygen.

Figure 5B:
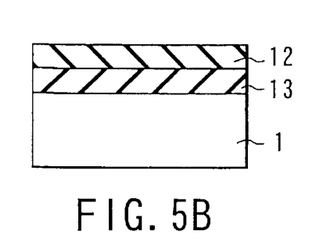

Then, as shown in FIG. 5B, a thin film containing a metal and having the capability of bonding with oxygen is formed on the surface of the Si substrate 1. Although the protection film of single layer was employed in Example 1, a laminate structure containing of a silicon oxide film 12 which is short of oxygen, and a metal oxide film 13 which is short of oxygen is employed in this example.

This laminated oxidation preventive film can be formed by sputtering. Namely, first of all, a thin metal oxide film having a thickness of about 2 nm was deposited on the Si substrate 1 by an RF sputtering using a metal oxide target having a stoichiometric composition under the conditions of: 22 sccm in Ar flow rate; and 300 W in electric power. As a result, the surface of the Si substrate 1 was slightly oxidized to obtain the structure as shown in FIG. 5B. If oxygen gas is mixed into the process gas on the occasion of this deposition, the oxidation of the surface of the Si substrate 1 would be extreme. Therefore, it is very important to prevent oxygen gas from being mixed into the process gas so as to obtain a non-oxidizing atmosphere.

Figure 5C:
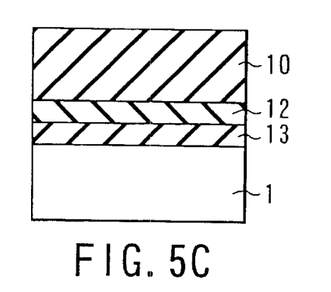

Thereafter, the sputtering of a metal oxide was performed using a mixed gas comprising argon gas and oxygen gas, 22 sccm in Ar flow rate and 1.2 sccm in oxygen gas flow rate, and an electric power of 300 W, thereby obtaining the structure as shown in FIG. 5C.

The resultant structure was then subjected to a heat treatment at a temperature of 900° C. for about 30 minutes to thereby obtain the structure which was similar to that shown in FIG. 3B.

As described above, according to Example 2, the thin film having the capability of bonding with oxygen was constituted by a laminate structure containing a silicon oxide film which was short of oxygen, and a metal oxide film which was short of oxygen and formed on the surface of the silicon oxide film. According to this thin film having the capability of bonding with oxygen, the metal oxide layer constituting the upper layer thereof is enabled to bond with a residual quantity of oxygen on the occasion of forming a metal oxide film of stoichiometric composition on the surface thereof or on the occasion of heat treatment which will be subsequently performed. As a result, the oxidation of the underlying silicon substrate can be prevented by this overlying metal oxide film. On the other hand, the silicon oxide film constituting the lower layer of the laminated thin film functions to achieve an excellent interface characteristic with respect to the substrate. Moreover, this silicon oxide film also functions to absorb a residual quantity of oxygen which has not absorbed by the overlying metal oxide film, thereby inhibiting the oxidation of the underlying silicon substrate.

As seen from these Examples 1 and 2, the present inventors have succeeded in suppressing the oxidation of the Si surface by the provision of a thin film containing a metal and having the capability of bonding with oxygen, which is formed on the surface of silicon substrate. This thin film having the capability of bonding with oxygen functions as an Si surface oxidation preventive film, and can be formed in an atmosphere containing a low concentration of oxygen.

As a result of further studies based on the aforementioned findings, the present inventors have succeeded in finding out a novel manufacturing method of a semiconductor device, which is featured in that the formation of the interface reaction layer mainly containing $SiO_2$ can be inhibited, and that a gate insulating film formed of a titanium oxide is formed on the surface of silicon substrate.

Namely, according to another aspect of this invention, there is provided a method of manufacturing a semiconductor device, comprising:

removing an oxide film formed on a surface of a silicon substrate;

forming a buffer layer on said silicon substrate by sputtering using a titanium oxide as a target under an oxygen gas flow rate ranging from 0 sccm to 1.2 sccm, said buffer layer having a thickness of 2 nm or less and comprising an oxide containing titanium and silicon with an atomic percentage of said titanium being in the range of 1 to 8%; and forming a gate insulating film comprising a titanium oxide on said buffer layer by sputtering using a titanium oxide as a target under an oxygen gas flow rate of not less than 10 sccm.

According to still another aspect of this invention, there is also provided a semiconductor device, comprising:

a silicon substrate;

a buffer layer formed on said silicon substrate, said buffer layer having a thickness of 2 nm or less and comprising an oxide containing titanium and silicon with an atomic percentage of said titanium being in the range of 1 to 8%;

a gate insulating film containing titanium oxide and formed on said buffer layer;

a gate electrode formed on said gate insulating film; and source and drain regions formed in said silicon substrate.

The semiconductor device according to one embodiment of this invention may comprise an $SiO_2$ layer having a thickness of 1 nm or less, which is interposed between the buffer layer and the silicon substrate.

Further, the buffer layer may contain nitrogen atoms.

According to this embodiment, for the purpose of suppressing the generation of the interface reaction layer mainly containing $SiO_2$, a buffer layer comprising titanium atoms, silicon atoms and oxygen atoms is formed in advance on the surface of the silicon substrate prior to the deposition of a titanium oxide film. Further, for the purpose of maintaining an excellent quality interface with respect to the silicon substrate without substantially deteriorating the magnitude of the insulating film capacity, the ratio of components contained in the buffer layer as well as the thickness of the buffer layer are confined to an optimum range, respectively. More specifically, the thickness of the buffer layer is confined to 2 nm or less, and the constituent elements are limited to an oxide comprising titanium and silicon, wherein the atomic percentage of the titanium is confined to the range of 1 to 8%.

The thickness of the buffer layer on this occasion may be at least 0.5 nm. By the term "atomic percentage", it is intended to mean a ratio of specific atoms existing in a film relative to the total number of all kinds of atoms existing in the film.

Next, the method of another embodiment of the present invention will be explained with reference to the formation of a gate insulating film comprising a titanium oxide on a silicon substrate, which can be realized while controlling the growth of the interface reaction layer mainly comprising $SiO_2$.

First of all, for the purpose of confirming the problems of the prior art, a titanium oxide film was directly deposited on the surface of silicon substrate.

Figure 6A:
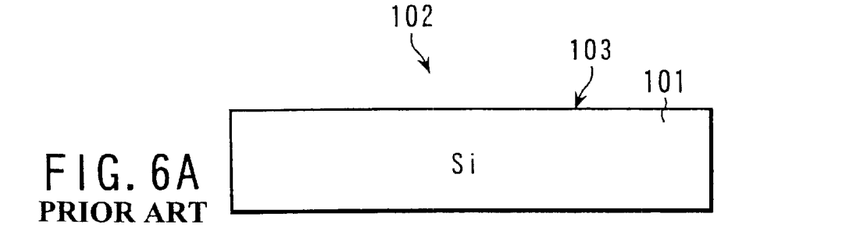
FIGS. 6A and 6B respectively shows a cross-sectional view illustrating, stepwise, the process of depositing a titanium oxide film on the surface of a silicon substrate by CVD.
Figure 6B:
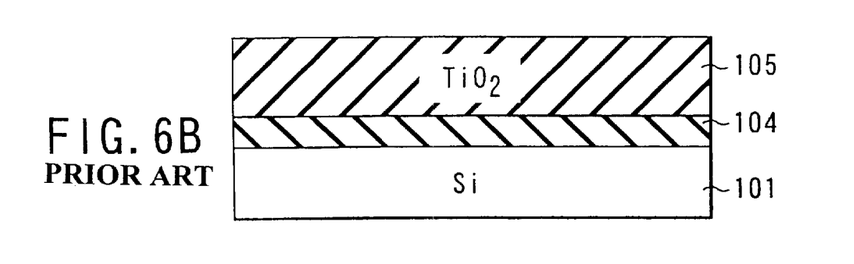

FIGS. 6A and 6B respectively shows a schematic view illustrating the features of the titanium oxide film formed on the surface of silicon substrate by CVD (Chemical Vapor Deposition) according to the prior art.

In this method, a silicon substrate 101 whose surface was made free in advance from any natural oxide film was prepared at first as shown in FIG. 6A. Then, a source of titanium 102 such as a titanium-containing organometallic gas and a source of oxygen 103 were supplied onto the surface of the silicon substrate 101.

As a result of this conventional method of forming the oxide film by CVD, an interface reaction layer 104 mainly comprising $SiO_2$ and having a thickness of about 2 nm was formed at the interface between the silicon substrate 101 and the titanium oxide film 105 as shown in FIG. 6B.

Figure 7A:
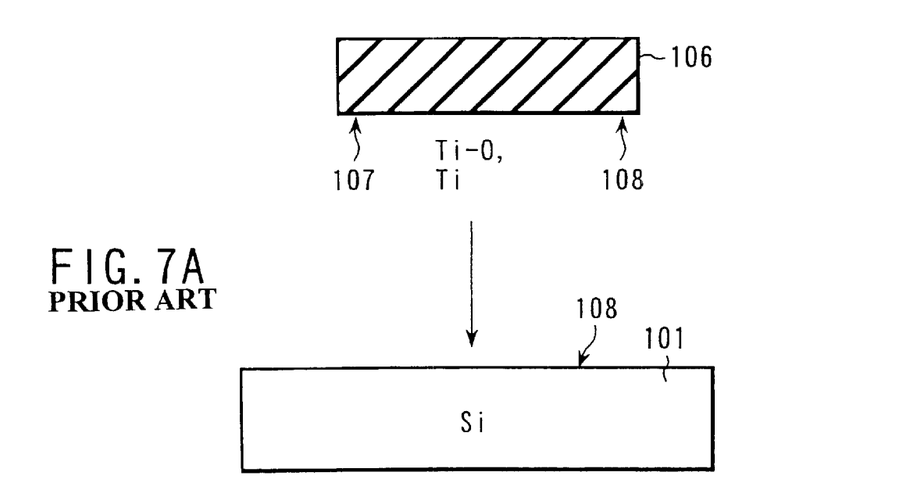
FIGS. 7A and 7B respectively shows a cross-sectional view schematically illustrating, stepwise, the process of depositing a titanium oxide film on the silicon substrate by reactive sputtering method.
Figure 7B:
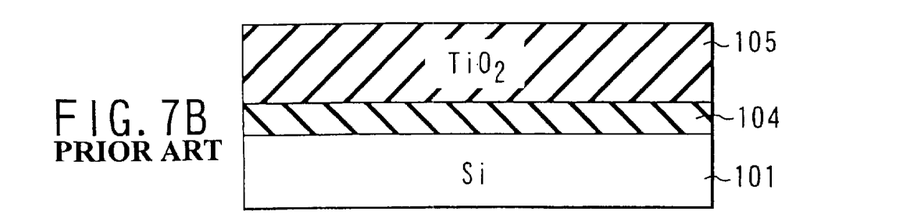

FIGS. 7A and 7B respectively shows a schematic view illustrating the features of the titanium oxide film formed on the surface of silicon substrate by sputtering method according to the prior art.

In this method, a silicon substrate 101 whose surface was made free in advance from any natural oxide film was prepared at first as shown in FIG. 7A. Then, excited argon 107 was irradiated onto a titanium target 106 in an oxygen atmosphere 108 to thereby feed Ti—O and Ti onto the surface of the silicon substrate 101.

As a result, even in this method of forming the oxide film by sputtering, an interface reaction layer 104 mainly comprising $SiO_2$ and having a thickness of about 2 nm was formed at the interface between the silicon substrate 101 and the titanium oxide film 105 as shown in FIG. 7B.

What is common to these conventional film-forming methods is the fact that the surface of silicon layer is exposed to a large quantity of oxygen in the initial stage in which a titanium oxide is being formed on the surface of silicon substrate 101. This means that a larger quantity of oxygen than that of titanium would be supplied to a chemically active surface of silicon substrate 101, thus making it one of important causes for forming an interface reaction layer 104 mainly comprising $SiO_2$ of low dielectric constant and having a thickness of about 2 nm.

According to the prior art, in view of enhancing the bulk properties of titanium oxide, there has been a tendency in general to excessively supply oxygen gas on the occasion of forming an oxide film. The reason for this can be ascribed to the fact that since oxygen atoms can easily escape out of titanium oxide, unless oxygen gas is supplied excessively, it is impossible to obtain a titanium oxide film having a stoichiometric composition.

However, the interface reaction layer to be generated in this manner would be such that the thickness thereof is at least 2 nm, and that the relative dielectric constant thereof is as low as about 4 since the layer mainly comprising $SiO_2$, thereby decreasing the insulating film capacity.

Based on the aforementioned circumstances, the following measures are taken in another embodiment of this invention. First of all, a buffer layer containing a titanium oxide is formed on the surface of silicon substrate using a titanium oxide film as a target while supplying a limited quantity of oxygen gas or without supplying oxygen gas at all. Subsequently, a gate insulating film comprising a titanium oxide is formed on the surface of this buffer layer by sputtering using a titanium oxide as a target in an atmosphere to which a sufficient quantity of oxygen gas is now permitted to feed.

EXAMPLE 3

FIGS. 8A to 8D respectively shows a schematic view illustrating a method of forming a gate insulating film comprising a titanium oxide according to one example of this invention.

Figure 8A:
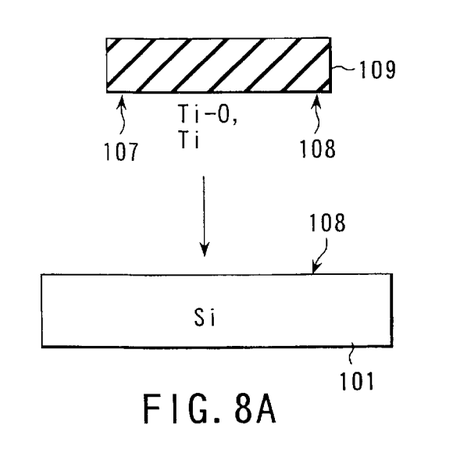
FIGS. 8A to 8D respectively shows a cross-sectional view schematically illustrating, stepwise, the process of successively depositing a buffer layer and a titanium oxide film on the silicon substrate according to one embodiment of the present invention.

First of all, a silicon substrate 101 whose surface was made free in advance from any nature oxide film was prepared as shown in FIG. 8A. Then, an activated argon 107 was irradiated onto a target 109 containing titanium oxide so as to sputter the titanium oxide, thereby feeding Ti—O and Ti onto the surface of the silicon substrate 101. During this sputtering, only a very limited quantity of oxygen gas was supplied to the reaction atmosphere, or no oxygen gas was supplied to the reaction atmosphere. However, since titanium oxide was employed as a target, oxygen 108 was allowed to evaporate from this titanium oxide, thus making it possible to supply oxygen gas to the surface of silicon substrate 101.

Figure 8B:
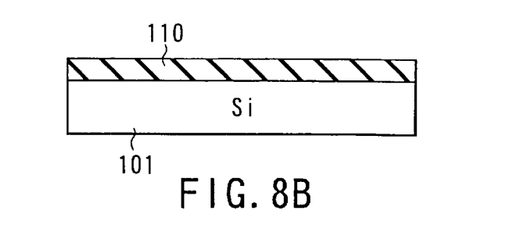

As a result, a buffer layer 110 comprising an oxide containing titanium and silicon was formed on the surface of silicon substrate 101 as shown in FIG. 8B. During this reaction, the formation of titanium oxide film and the oxidation of the surface of silicon substrate 101 were permitted to proceed concurrently, thereby enabling the titanium, silicon and oxygen to exist concurrently in the buffer layer 110.

Figure 8C:
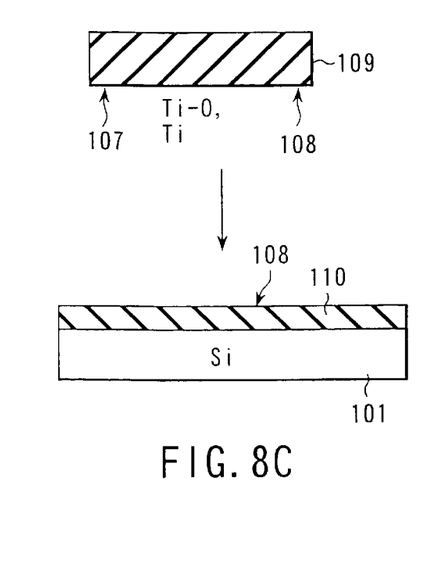
Figure 8D:
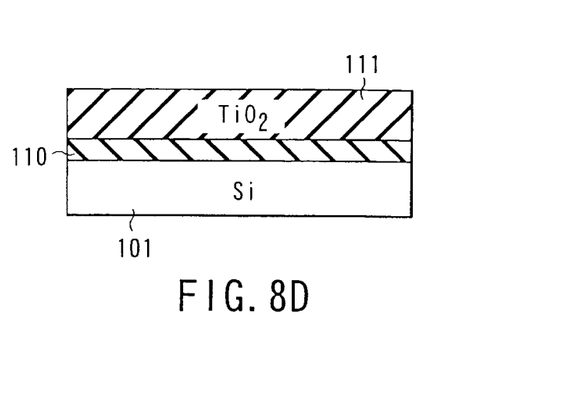

Then, as shown in FIG. 8C, a sufficient quantity of oxygen gas 108 was fed to the atmosphere, and excited argon 107 was irradiated onto the titanium oxide target 109 to thereby feed Ti—O or Ti to the surface of the buffer layer 110. Since the oxygen gas 108 was sufficiently supplied during this reaction, it was possible to form a titanium oxide layer having a stoichiometric composition with respect to titanium atoms and oxygen atoms and exhibiting excellent electric properties. As a result of these procedures, a gate insulating film 111 comprising a titanium oxide was formed on the surface of the buffer layer 110 as shown in FIG. 8D.

Since a two-step process (i.e. a first step being performed with a limited supply of oxygen or without the supply of oxygen on the occasion of forming the buffer layer, and a second step being performed with a sufficient quantity of oxygen on the occasion of forming the gate insulating film) was adopted in the formation of a buffer layer as explained above, it was possible to form a buffer layer comprising a titanium oxide which was excellent in bulk properties, and an oxide containing titanium and silicon therein and exhibiting a high relative dielectric constant.

Figure 9:
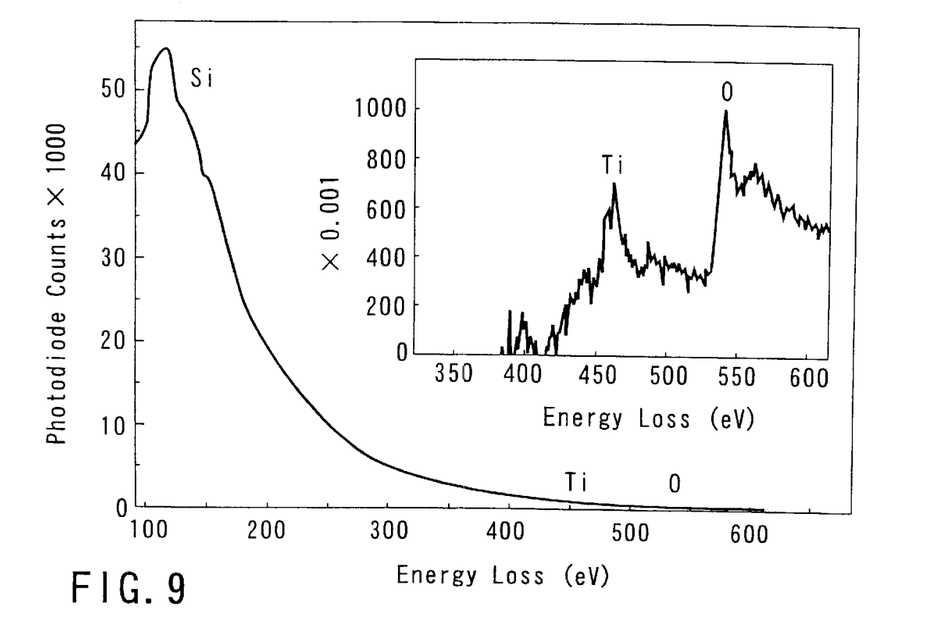
FIG. 9 is a graph illustrating the results of elemental analysis of the buffer layer which has been deposited according to the method representing one embodiment of the present invention.

FIG. 9 is a graph illustrating the results of elemental analysis of the buffer layer.

As shown in FIG. 9, titanium atoms, silicon atoms and oxygen atoms were all included in the buffer layer. Since titanium atom was included in the buffer layer, the dielectric constant of the buffer layer became higher than that of $SiO_2$.

Figure 10:
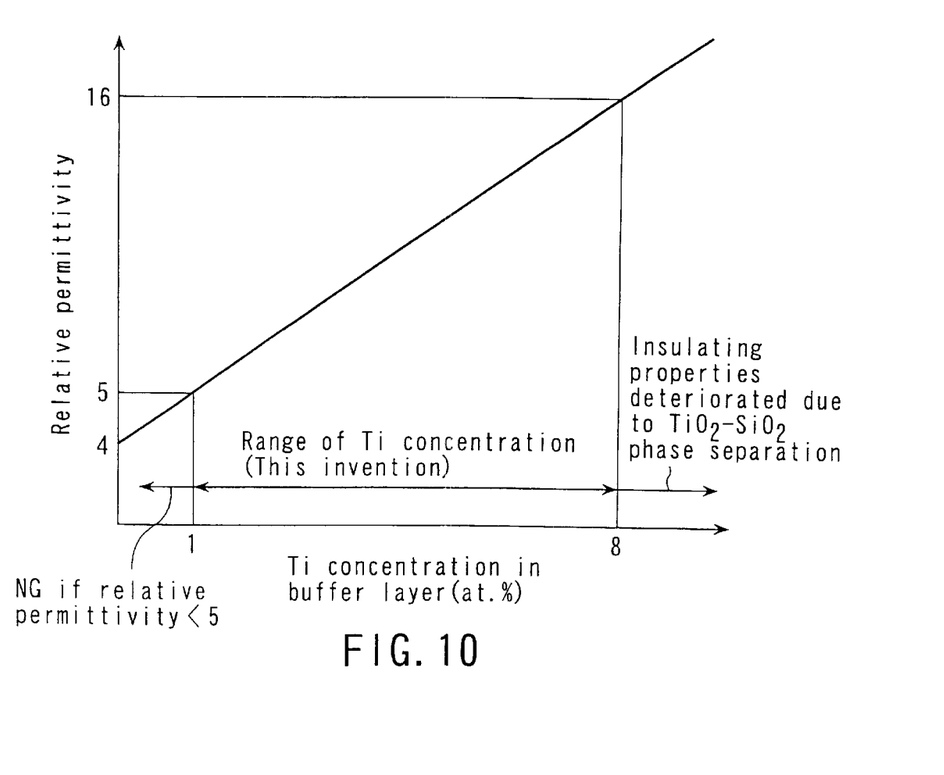
FIG. 10 is a graph illustrating the relationship between the atomic percentage of Ti atoms and the relative dielectric constant in the buffer layer which has been deposited according to the method representing one embodiment of the present invention.

FIG. 10 shows a graph illustrating the relationship between the atomic percentage of Ti atoms and the relative dielectric constant in the buffer layer which has been deposited by the method according to this example.

As seen from FIG. 10, as the concentration of titanium in a $TiSi_xO_y$ film (wherein x and y are numerals representing compositional ratios of these elements) becomes higher, the dielectric constant of the $TiSi_xO_y$ film increases proportionally. However, if the content of titanium atom is increased excessively, the $TiSi_xO_y$ is disintegrated into a $TiO_2$ phase and an $SiO_2$ phase, thereby enabling the titanium oxide to crystallize and hence raising the problem of increase in leak current. Further, when $SiO_2$ is produced due to the phase separation of the $TiSi_xO_y$, the relative dielectric constant of the buffer layer would be decreased. The phase separation of the $TiSi_xO_y$ into $TiO_2$ and $SiO_2$ phases was found to become prominent as the atomic percentage of titanium exceeds 8% or so. Therefore, in this embodiment, the buffer layer comprising an oxide containing titanium and silicon is confined to such that the atomic percentage of titanium is 8% or less.

Further, as seen from FIG. 10, if the atomic percentage of titanium is too low, the relative dielectric constant of the buffer layer would be decreased. For example, when the atomic percentage of titanium is less than 1%, the relative dielectric constant of the buffer layer would become lower than 5. In view of these facts, if the film thickness of the buffer layer is assumed as being 2 nm for example, the film thickness of gate insulating film would correspond to 1.6 nm $SiO_2$ film, thereby presumably making it impossible to satisfy the condition of 1.5 nm based on $SiO_2$ film as specified with regard to the so-called sub-0.1 μm generation. Therefore, it is specified in this invention that the atomic percentage of titanium should be 1% or more. The film thickness of the buffer layer in this case should be confined to 2 nm or less. Since the buffer layer in the method of this embodiment was formed by sputtering, the thickness of the buffer layer can be easily controlled. It is confirmed through experiments conducted by the present inventors that the thickness of the buffer layer can be controlled to 1.5 nm or less. As for the lower limit of the thickness of buffer layer, there is not any particular limitation as far as it is capable of inhibiting the generation of the $SiO_2$ interface layer at the step of forming a titanium oxide film which will be performed following the step of forming this buffer layer. For example, the lower limit of the thickness of buffer layer may be 0.5 nm. However, if the thickness of $SiO_2$ film can be confined to 0.1 nm or less, the growth of $SiO_2$ film to such an extent would not raise any problem since it is sufficiently thin even if it is converted to the thickness of $SiO_2$ layer.

The buffer layer comprising $TiSi_xO_y$ should preferably be formulated such that the atomic percentage of titanium atoms is in the range of 2 to 4%. The buffer layer according to this embodiment should preferably be formed of, microscopically, a mixture comprising $TiO_2$ and $SiO_2$. Further, the atomic percentage of silicon in this buffer layer should preferably be in the range of 25 to 32%, more preferably in the range of 29 to 31%. Additionally, in view of improving not only the interface characteristics between the silicon substrate and the buffer layer but also the insulating film capacity, the atomic percentage of oxygen should preferably be about 66%.

Moreover, the buffer layer may contain nitrogen atom at a concentration of $1 \times 10^{20}/cm^3$.

The restriction of oxygen flow rate during the process of forming the buffer layer according to this embodiment is also effective in reducing the thickness of the buffer layer as compared with the conventional methods. More specifically, it is possible, through the complete elimination of oxygen, to reduce the thickness of buffer layer down to 1.5 nm or less as against about 2 nm in the prior art.

According to this embodiment, the flow rate of oxygen on the occasion of forming the buffer layer is confined to the range of 0 sccm to 1.2 sccm, thereby controlling the ratio between Ti and O so as to make it sufficiently lower than its stoichiometric composition ($TiO_2$). It should be noted in this case that the thickness of buffer layer, the atomic percentage of titanium atom and the relative dielectric constant will be greatly influenced by the magnitude of this oxygen flow rate. For example, if it is desired to enhance the relative dielectric constant so as to increase the insulating film capacity of buffer layer, oxygen should preferably be completely eliminated. On the other hand, if the atomic percentage of titanium is increased, a leak current will be generated.

Therefore, the presence of oxygen is desirable if it is desired to preferentially minimize the leak current.

After the buffer layer has been formed on the surface of silicon substrate according to the method explained above, a gate insulating film is deposited by sputtering method while feeding a large quantity of oxygen, which is optimal for enhancing the bulk properties of titanium oxide.

Figure 11:
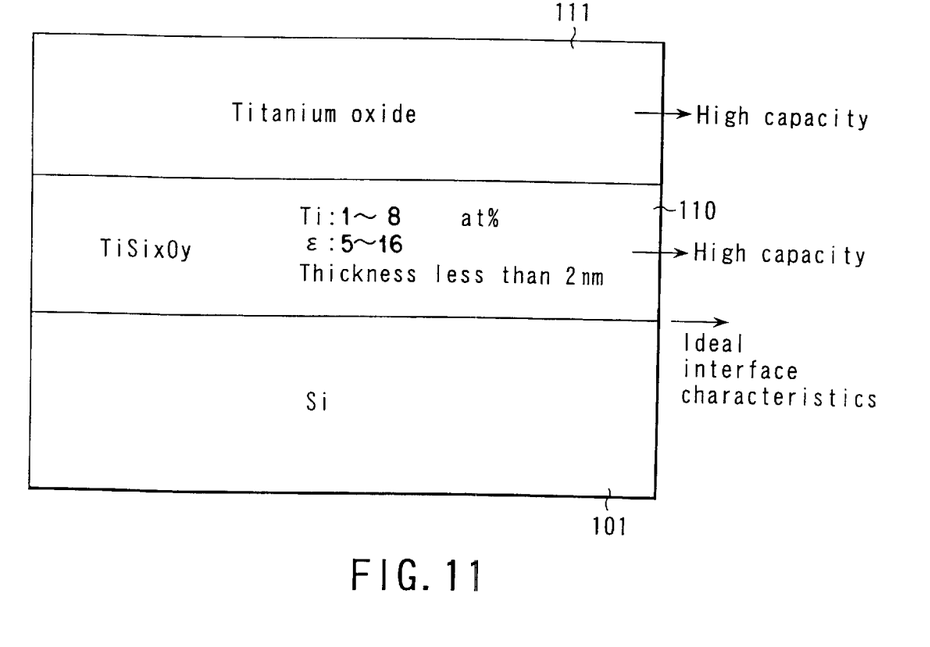
FIG. 11 shows a cross-sectional view illustrating a laminate structure comprising a silicon substrate/a TiSiO buffer layer/a titanium oxide film which has been deposited according to the method representing one embodiment of the present invention.

FIG. 11 shows a cross-sectional view illustrating a laminate structure comprising a silicon substrate/a TiSiO buffer layer/a titanium oxide film which was deposited according to the method of this embodiment.

As shown in FIG. 11, if the atomic percentage of titanium in the buffer layer is confined to the range of 1 to 8%, more preferably to the range of not more than 4%, and at the same time, if the thickness of the buffer layer is confined to 2 nm or less, an ideal interface characteristics would be obtained.

Figure 12:
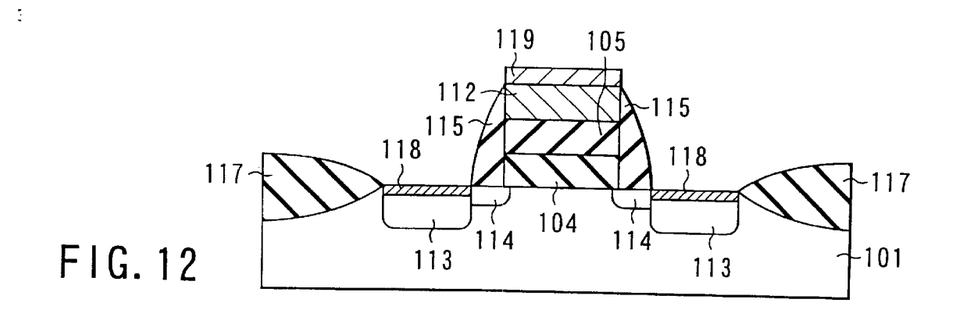
FIG. 12 is a cross-sectional view illustrating the field effect transistor according to one embodiment of the present invention.

FIG. 12 shows a cross-sectional view illustrating the field effect transistor wherein the gate insulating film thereof was formed by the method according to the aforementioned one embodiment of the present invention.

As shown in FIG. 12, this field effect transistor comprises a silicon substrate 101, a buffer layer 104 formed on the silicon substrate 101, a gate insulating film 105 comprising a polycrystalline silicon, etc. and formed on the buffer layer 104; and a gate electrode 112 formed on the gate insulating film 105.

The buffer layer 104 is constituted by an oxide containing titanium and silicon with an atomic percentage of said titanium being in the range of 1 to 8%. This buffer layer 104 is formed so as to have a thickness of 2 nm or less. The gate insulating film 105 is constituted by a titanium oxide film.

On the sidewall of the laminate structure comprising the buffer layer 104/the gate insulating film 105/the gate electrode 112, there is formed a gate sidewall 115 which is comprising a silicon oxide or a silicon nitride. Below the gate insulating film 105 formed in the silicon substrate 101, there is formed a channel region. On both sides of this channel region, there are formed a deep diffusion region 113 wherein an impurity is diffused at a high concentration, and a shallow diffusion region 114, thereby forming a structure of source region/drain region. The reference numeral 117 denotes an element isolation region; 118 denotes a silicide formed on the deep diffusion region 113; and 119 denotes a silicide formed on the gate electrode 112.

Next, the manufacturing method of the field effect transistor shown in FIG. 12 will be explained with reference to FIGS. 13A to 13D.

Figure 13A:
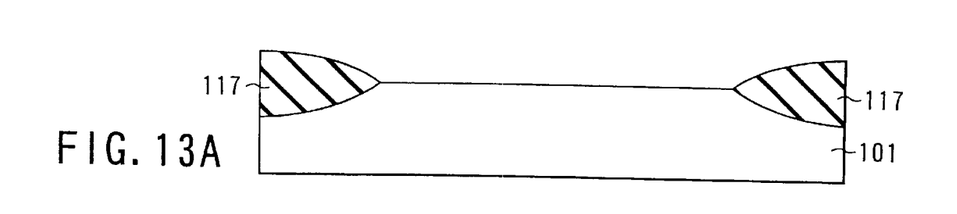
FIGS. 13A to 13D respectively shows a cross-sectional view illustrating, stepwise, the manufacturing method of the field effect transistor according to one embodiment of the present invention.

First of all, as shown in FIG. 13A, the element isolation region 117 comprising a silicon oxide, etc. is formed through ordinary steps on a predetermined region of the silicon substrate 101. Then, the natural oxide film existing on the surface of the silicon substrate 101 is peeled away by treating it with a dilute HF solution, thereby enabling the surface of silicon to be terminated with hydrogen. This step is very important for completely eliminating residual oxygen from the Si surface.

Figure 13B:
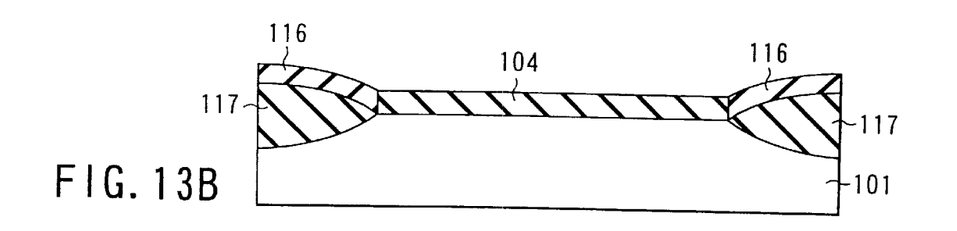

Next, as shown in FIG. 13B, the buffer layer 104 constituted by titanium atoms, silicon atoms and oxygen atoms is formed on the surface of silicon substrate 101. The buffer layer 104 was formed by sputtering method which has been illustrated with reference to FIGS. 8A and 8B.

Specifically, the buffer layer 104 was deposited using a $TiO_2$ target, wherein argon excited by an RF sputtering was irradiated onto the $Ti_2$ target. The conditions of gas flow rate on this occasion were: 20 sccm in Ar gas flow rate; and 0 sccm to 1.2 sccm in which range the oxygen gas flow rate was altered, thereby forming the buffer layer. As a result of this step, it was possible to obtain various kinds of buffer layers, i.e. a 1.3 nm thick layer (when oxygen flow rate was 0 sccm) to a 1.8 nm thick layer (when oxygen flow rate was 1.2 sccm). Of course, $TiO_x$ (x<2) 116 is deposited on the surface of the element isolation region 117.

Figure 13C:
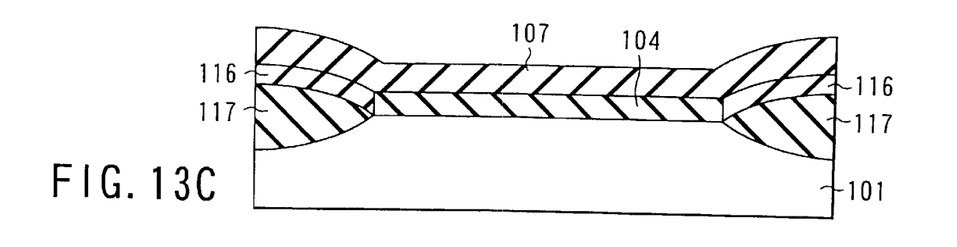

Next, as shown in FIG. 13C, a titanium oxide film 107 of high dielectric constant is deposited all over the surface of substrate. The titanium oxide film 107 was formed by sputtering method which has been illustrated with reference to FIGS. 8C and 8D.

Specifically, $TiO_2$ was employed as a target, to which argon excited by an RF sputtering and oxygen were irradiated onto the $TiO_2$ target. The conditions of gas flow rate on this occasion were: 10 sccm in Ar gas flow rate; and 10 sccm in oxygen gas flow rate. The conditions employed in this case were necessary for depositing a titanium oxide having a stoichiometric composition and excellent electric properties. The thickness of titanium oxide layer 104 in this case should preferably be 1 nm or more in view of inhibiting the generation of a leak current.

These sputtering steps were continuously performed in the same apparatus with only the conditions for the gas flow rate being altered. It is possible in this manner to form the buffer layer 104 and the gate insulating film 107 in a strictly controlled gas atmosphere without breaking the vacuum. The sputtering procedure in this manner is very important in view of preventing the insulating film from being contaminated by carbon, oxygen, nitrogen, etc. as well as in view of improving the properties of the insulating film.

Figure 13D:
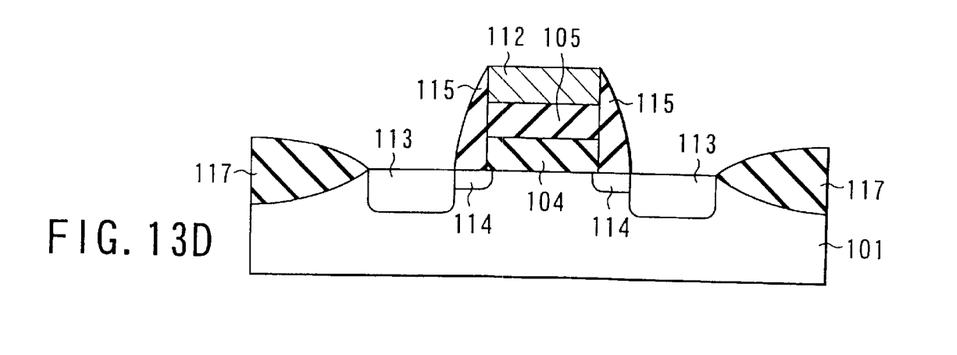

Then, as shown in FIG. 13D, a gate electrode material such as TiN, polysilicon, etc. was deposited by the ordinary steps, and then, worked by etching to thereby obtain the gate electrode 112. Then, using the gate electrode 112 as a mask, an impurity was ion-implanted in the silicon substrate 101 to form a shallow diffusion region 114. Subsequently, silicon oxide or silicon nitride was deposited all over the surface of substrate and then, the resultant layer was subjected to anisotropic etching to form the gate sidewall 115 on the sidewall of the laminated structure comprising buffer layer 104/gate insulating film 105/gate electrode 112. Further, using the gate electrode 112 and gate sidewall 115 as a mask, an impurity was ion-implanted in the silicon substrate 101 to thereby form a deep diffusion region 113. The accelerating voltage of the impurity on this occasion should be higher than that employed for the shallow diffusion region 114. These impurity implantations will be conducted concurrently also against the gate electrode 112.

Next, by heat treatment, the impurity ions introduced into the shallow diffusion region 114, the deep diffusion region 113 and the gate electrode 112 were activated. Even if the gate insulating film 107 contained an excessive quantity of oxygen, it can be absorbed by the buffer layer 104, thereby preventing the redundant growth of the interface silicon oxide film in the same manner as in Examples 1 and 2. The temperature for the heat treatment varies depending on the specific material to be employed for the gate electrode 112. Typically, a temperature in the range of 900 to 1050° C. would be required for this heat treatment.

Figure 14A:
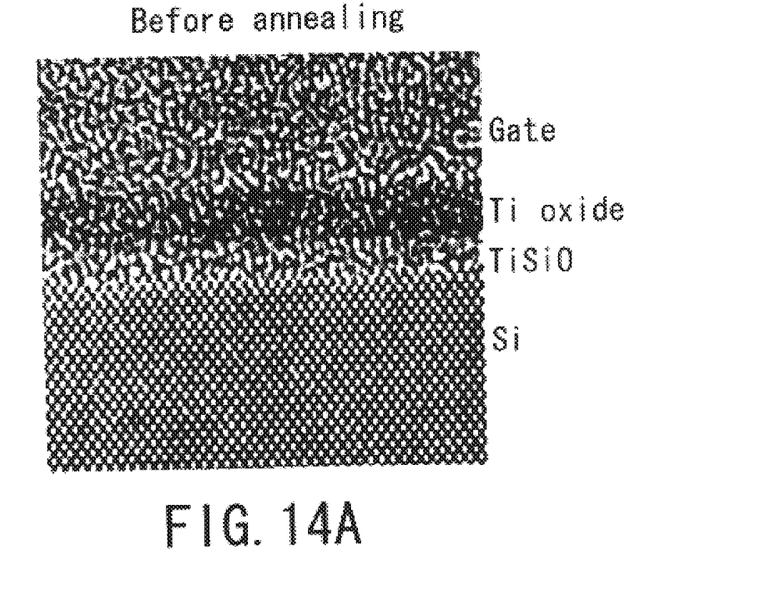
FIGS. 14A and 14B respectively shows a photograph illustrating the states before and after the heat treatment of a laminate structure comprising a silicon substrate/a buffer layer/a titanium oxide gate insulating film/a gate electrode according to one embodiment of the present invention.
Figure 14B:
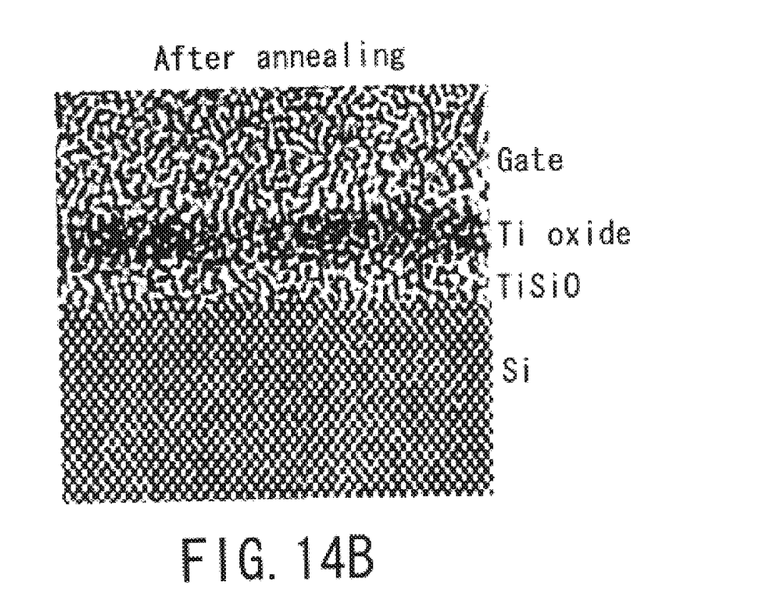

FIGS. 14A and 14B respectively shows a photograph illustrating the states before and after the heat treatment of a laminate structure comprising silicon substrate 101/buffer layer 104 containing $TiSi_xO_y$/titanium oxide gate insulating film 105/gate electrode 112, i.e. FIG. 14A before the heat treatment, and FIG. 14B after the heat treatment.

Since the flatness of the titanium oxide film 105 can be maintained, little change in thickness of the TiSiO buffer layer 104 can be recognized between those obtained before (FIG. 14A) and after (FIG. 14B) the heat treatment. Further, no aggregation can be recognized in the titanium oxide film 105. It was also found that the problem of the deterioration of capacity due to the re-growth of the buffer layer 104 would be such that can be disregarded.

As explained above, the laminated insulating film structure according to this embodiment of the present invention was found as having a sufficient thermal resistance to withstand the conventional steps of manufacturing the CMOS.

Then, Co was vapor-deposited on the substrate and heat-treated, thereby forming, as shown in FIG. 12, a silicide 118 on the deep diffusion region 113, and a silicide 119 on the gate electrode 112, thus obtaining the aforementioned field effect transistor.

Figure 15:
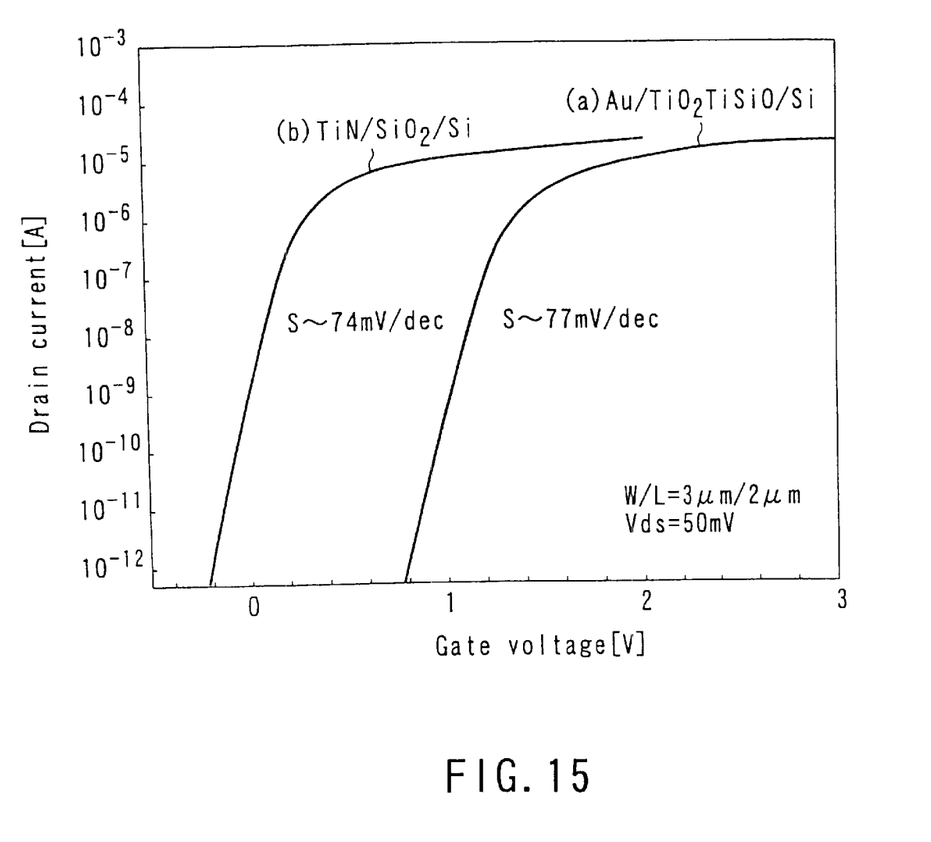
FIG. 15 shows a graph illustrating the voltage/current characteristics of the field effect transistor according to one embodiment of the present invention and of the field effect transistor wherein a silicon oxide was employed as the gate insulating film thereof.

The voltage/current characteristics of the field effect transistor thus manufactured is shown as a curve "a" in FIG. 15. Further, the voltage/current characteristics of the field effect transistor wherein a silicon oxide film was employed as the gate insulating film thereof is also shown as a curve "b" in FIG. 15. In the graph of FIG. 15, the ordinate represents the gate electrode, and the abscissa represents the source/drain current.

As seen from the curve "a", the characteristics of the field effect transistor according to this example was found such that the S factor as a barometer of the interface characteristics (a variation of gate voltage relative to the change of drain current by one figure) was almost identical with that (the curve "b") of the field effect transistor wherein a silicon oxide film was employed as the gate insulating film. It will be seen from this result that the field effect transistor according to this example was capable of exhibiting excellent interface characteristics.

According to the present invention, it is possible to provide a semiconductor device which is capable of realizing not only excellent interface properties but also a high capacity of 1.5 nm or less based on $SiO_2$ film, and also capable of suppressing the generation of a tunnel current.

This invention will be useful for the manufacture of a semiconductor device wherein a metal oxide is employed as a gate insulating film, and hence this invention will be very valuable from an industrial viewpoint.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
   removing an oxide film formed on a surface of a silicon substrate;
   forming a buffer layer on said silicon substrate by sputtering using a titanium oxide as a target under an oxygen gas flow rate ranging from 0 sccm to 1.2 sccm, said buffer layer having a thickness of 2 nm or less and comprising an oxide containing titanium and silicon with an atomic percentage of said titanium being in the range of 1 to 8%; and
   forming a gate insulating film comprising a titanium oxide on said buffer layer by sputtering using a titanium oxide as a target under an oxygen gas flow rate of not less than 10 sccm.

2. The method according to claim 1, wherein said buffer layer and said gate insulating film are successively deposited in the same apparatus.

3. The method according to claim 1, wherein said buffer layer is constituted by a $TiSi_xO_y$, wherein x and y are numerals representing compositional ratios of these elements.

4. The method according to claim 1, wherein said buffer layer contains nitrogen atom at a concentration of $1\times10^{20}/cm^3$ or less.

5. The method according to claim 1, wherein said buffer layer is formed with an oxygen gas flow rate being controlled to 0 sccm.

6. A semiconductor device, comprising:
   a silicon substrate;
   a buffer layer formed on said silicon substrate, said buffer layer having a thickness of 2 nm or less and comprising an oxide containing titanium and silicon with an atomic percentage of said titanium being in the range of 1 to 8%;
   a gate insulating film containing titanium oxide and formed on said buffer layer;
   a gate electrode formed on said gate insulating film; and
   source and drain regions formed in said silicon substrate.

7. The semiconductor device according to claim 6, which further comprises an $SiO_2$ layer having a thickness of 1 nm or less, which is interposed between said buffer layer and said silicon substrate.

8. The semiconductor device according to claim 6, wherein said buffer layer contains nitrogen atom at a concentration of $1\times10^{20}/cm^3$ or less.

9. The semiconductor device according to claim 6, wherein said buffer layer has a thickness of 1.5 nm or less.

10. A method of manufacturing a semiconductor device, comprising:
    depositing a thin film containing a first metal oxide capable of bonding with oxygen over silicon substrate in an atmosphere which is substantially free from oxygen;
    forming a second metal oxide film on said thin film is formed in an atmosphere containing oxygen; and
    oxidizing said thin film by heat treatment to form a gate insulating film comprising said oxidized thin film and said second metal oxide film.

11. The method according to claim 10, wherein said first metal oxide comprises at least one metal selected from the group consisting of Ti, Ta, Zr, Hf, Mg, Al, Y, Bi, Ce and La.

12. The method according to claim 10, wherein said thin film is deposited in an atmosphere having an oxygen concentration of $10^{-3}$ Pa or less.

13. The method according to claim 10, wherein said heat treatment is performed at a temperature ranging from 900° C. to 1050° C.

14. The method according to claim 10, wherein said oxidation of the thin film is performed to oxidize said silicon substrate to a thickness of not more than 0.5 nm from the surface of said silicon substrate.

15. The method according to claim 10, wherein said thin film is bonded with oxygen diffusing to the surface of said silicon substrate during said heat treatment, thereby inhibiting oxidation of said silicon substrate.

16. The method according to claim 10, wherein said first metal oxide is offset in stoichiometric composition towards the oxygen shortage side.

17. A method of manufacturing a semiconductor device, comprising:

depositing a thin film containing a metal nitride over a silicon substrate, forming a metal oxide film on said thin film; and oxidizing said thin film by heat treatment to form a gate insulating film comprising said oxidized thin film and said metal oxide film.

18. The method according to claim 17, wherein said metal nitride comprises at least one metal selected from the group consisting of Ti, Ta, Zr, Hf, Mg, Al, Y, Bi, Ce and La.

19. The method according to claim 17, wherein said thin film is formed in an atmosphere which is substantially free from oxygen, and said metal oxide film is formed in an atmosphere containing oxygen.

20. The method according to claim 19, wherein said thin film is deposited in an atmosphere having an oxygen concentration of $10^{-3}$ Pa or less.

21. The method according to claim 17, wherein said heat treatment is performed at a temperature ranging from 900° C. to 1050° C.

22. The method according to claim 17, wherein said oxidation of the thin film is performed to oxidize said silicon substrate to a thickness of not more than 0.5 nm from the surface of said silicon substrate.

* * * * *